US008817230B2

(12) United States Patent
Vogel et al.

(10) Patent No.: US 8,817,230 B2
(45) Date of Patent: *Aug. 26, 2014

(54) IMMERSION PHOTOLITHOGRAPHY SYSTEM AND METHOD USING MICROCHANNEL NOZZLES

(75) Inventors: Herman Vogel, Sandy Hook, CT (US); Klaus Simon, Eindhoven (NL); Antonius Theodorus Anna Maria Derksen, Eindhoven (NL)

(73) Assignee: ASML Holding N.V., Veldhoven (NL)

( * ) Notice: Subject to any disclaimer, the term of this patent is extended or adjusted under 35 U.S.C. 154(b) by 228 days.

This patent is subject to a terminal disclaimer.

(21) Appl. No.: 13/397,223

(22) Filed: Feb. 15, 2012

(65) Prior Publication Data
US 2012/0140200 A1    Jun. 7, 2012

Related U.S. Application Data

(63) Continuation of application No. 13/187,118, filed on Jul. 20, 2011, which is a continuation of application No. 13/186,211, filed on Jul. 19, 2011, which is a continuation of application No. 12/060,514, filed on Apr. 1, 2008, now Pat. No. 8,004,649, which is a continuation of application No. 11/053,328, filed on Feb. 9, 2005, now Pat. No. 7,411,650, which is a continuation of application No. 10/464,542, filed on Jun. 19, 2003, now Pat. No. 6,867,844.

(51) Int. Cl.
*G03B 27/52*    (2006.01)
*G03B 27/42*    (2006.01)
*G03B 27/32*    (2006.01)
*G03F 7/20*    (2006.01)

(52) U.S. Cl.
CPC ........... *G03F 7/709* (2013.01); *G03F 7/70358* (2013.01); *G03F 7/70341* (2013.01)
USPC ................................ 355/30; 355/53; 355/77

(58) Field of Classification Search
CPC .................................................. G03F 7/70341
USPC ............................................. 355/30, 53, 55
See application file for complete search history.

(56) References Cited

U.S. PATENT DOCUMENTS 3,573,975 A   4/1971   Dhaka et al.
3,648,587 A   3/1972   Stevens
(Continued)

FOREIGN PATENT DOCUMENTS

DE   206 607   2/1984
DE   221 563   4/1985
(Continued)

OTHER PUBLICATIONS

Japanese Office Action mailed Feb. 22, 2013 in corresponding Japanese Patent Application No. 2010-293569.
(Continued)

*Primary Examiner* — Peter B Kim
(74) *Attorney, Agent, or Firm* — Pillsbury Winthrop Shaw Pittman LLP

(57) ABSTRACT

A liquid immersion photolithography system includes an exposure system that exposes a substrate with electromagnetic radiation and includes a projection optical system that focuses the electromagnetic radiation on the substrate. A liquid supply system provides liquid flow between the projection optical system and the substrate. Further, the liquid is extracted using a two dimensional array of extraction openings.

20 Claims, 6 Drawing Sheets

(56) References Cited

U.S. PATENT DOCUMENTS

| | | |
|---|---|---|
| 4,346,164 A | 8/1982 | Tabarelli et al. |
| 4,390,273 A | 6/1983 | Loebach et al. |
| 4,396,705 A | 8/1983 | Akeyama et al. |
| 4,405,701 A | 9/1983 | Banks et al. |
| 4,480,910 A | 11/1984 | Takanashi et al. |
| 4,509,852 A | 4/1985 | Tabarelli et al. |
| 5,040,020 A | 8/1991 | Rauschenbach et al. |
| 5,610,683 A | 3/1997 | Takahashi |
| 5,715,039 A | 2/1998 | Fukuda et al. |
| 5,825,043 A | 10/1998 | Suwa |
| 5,900,354 A | 5/1999 | Batchelder |
| 5,994,430 A | 11/1999 | Ding et al. |
| 6,191,429 B1 | 2/2001 | Suwa |
| 6,236,634 B1 | 5/2001 | Lee et al. |
| 6,368,683 B1 | 4/2002 | Shirasaki |
| 6,560,032 B2 | 5/2003 | Hatano |
| 6,600,547 B2 | 7/2003 | Watson et al. |
| 6,603,130 B1 | 8/2003 | Bisschops et al. |
| 6,633,365 B2 | 10/2003 | Suenaga |
| 6,649,093 B2 | 11/2003 | Van Santen et al. |
| 6,721,031 B2 | 4/2004 | Hasegawa et al. |
| 6,721,035 B1 | 4/2004 | Segers et al. |
| 6,781,670 B2 | 8/2004 | Krautschik |
| 6,788,477 B2 | 9/2004 | Lin |
| 6,809,794 B1 | 10/2004 | Sewell |
| 6,844,206 B1 | 1/2005 | Phan et al. |
| 6,844,919 B2 | 1/2005 | Suenaga |
| 6,867,844 B2 | 3/2005 | Vogel et al. |
| 7,411,650 B2 | 8/2008 | Vogel et al. |
| 2002/0020821 A1 | 2/2002 | Van Santen et al. |
| 2002/0163629 A1 | 11/2002 | Switkes et al. |
| 2003/0123040 A1 | 7/2003 | Almogy |
| 2003/0174408 A1 | 9/2003 | Rostalski et al. |
| 2004/0000627 A1 | 1/2004 | Schuster |
| 2004/0021844 A1 | 2/2004 | Suenaga |
| 2004/0075895 A1 | 4/2004 | Lin |
| 2004/0103950 A1 | 6/2004 | Iriguchi |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0135099 A1 | 7/2004 | Simon et al. |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0207824 A1 | 10/2004 | Lof et al. |
| 2004/0211920 A1 | 10/2004 | Derksen et al. |
| 2004/0233405 A1 | 11/2004 | Kato et al. |
| 2004/0239954 A1 | 12/2004 | Bischoff |
| 2004/0257544 A1 | 12/2004 | Vogel et al. |
| 2004/0263808 A1 | 12/2004 | Sewell |
| 2004/0263809 A1 | 12/2004 | Nakano |
| 2005/0002004 A1 | 1/2005 | Kolesnychenko et al. |
| 2005/0007569 A1 | 1/2005 | Streefkerk et al. |
| 2005/0007570 A1 | 1/2005 | Streefkerk et al. |
| 2005/0018155 A1 | 1/2005 | Cox et al. |
| 2005/0018156 A1 | 1/2005 | Mulkens et al. |
| 2005/0018208 A1 | 1/2005 | Levinson |
| 2005/0024609 A1 | 2/2005 | De Smit et al. |
| 2005/0030498 A1 | 2/2005 | Mulkens |
| 2005/0030501 A1 | 2/2005 | Mulkens et al. |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0037269 A1 | 2/2005 | Levinson |
| 2005/0046934 A1 | 3/2005 | Ho et al. |
| 2005/0048223 A1 | 3/2005 | Pawloski et al. |
| 2005/0078286 A1 | 4/2005 | Dierichs et al. |
| 2005/0078287 A1 | 4/2005 | Sengers et al. |
| 2005/0168713 A1 | 8/2005 | Vogel et al. |
| 2005/0231695 A1 | 10/2005 | Wang et al. |
| 2005/0233081 A1 | 10/2005 | Tokita |
| 2006/0023183 A1 | 2/2006 | Novak et al. |

FOREIGN PATENT DOCUMENTS

| | | |
|---|---|---|
| DE | 224448 | 7/1985 |
| DE | 242880 | 2/1987 |
| EP | 0023231 | 2/1981 |
| EP | 0418427 | 3/1991 |
| EP | 0 834 773 | 4/1998 |
| EP | 1039511 | 9/2000 |
| EP | 1 420 298 | 5/2004 |
| EP | 1 571 698 | 9/2005 |
| EP | 1 628 330 | 2/2006 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 6-168866 | 6/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| TW | 513617 | 12/2002 |
| TW | 530193 | 5/2003 |
| WO | WO 99/49504 | 9/1999 |
| WO | WO 03/077036 | 9/2003 |
| WO | WO 03/077037 | 9/2003 |
| WO | WO 2004/019128 | 3/2004 |
| WO | WO 2004/053596 | 6/2004 |
| WO | WO 2004/053950 | 6/2004 |
| WO | WO 2004/053951 | 6/2004 |
| WO | WO 2004/053952 | 6/2004 |
| WO | WO 2004/053953 | 6/2004 |
| WO | WO 2004/053954 | 6/2004 |
| WO | WO 2004/053955 | 6/2004 |
| WO | WO 2004/053956 | 6/2004 |
| WO | WO 2004/053957 | 6/2004 |
| WO | WO 2004/053958 | 6/2004 |
| WO | WO 2004/053959 | 6/2004 |
| WO | 2004-057590 | 7/2004 |
| WO | WO 2004/055803 | 7/2004 |
| WO | WO 2004/057295 | 7/2004 |
| WO | WO 2004/057589 | 7/2004 |
| WO | WO 2004/086468 | 10/2004 |
| WO | WO 2004/086470 | 10/2004 |
| WO | WO 2004/090577 | 10/2004 |
| WO | WO 2004/090633 | 10/2004 |
| WO | WO 2004/090634 | 10/2004 |
| WO | WO 2004/090956 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2004/097911 | 11/2004 |
| WO | WO 2004/102646 | 11/2004 |
| WO | WO 2004/105106 | 12/2004 |
| WO | WO 2004/105107 | 12/2004 |
| WO | WO 2004/107011 | 12/2004 |
| WO | WO 2004/107417 | 12/2004 |
| WO | WO 2004/112108 | 12/2004 |
| WO | WO 2004/114380 | 12/2004 |
| WO | WO 2005/015315 | 2/2005 |
| WO | WO 2005/022616 | 3/2005 |

(56) References Cited

FOREIGN PATENT DOCUMENTS

| WO | WO 2005/036623 | 4/2005 |
|---|---|---|
| WO | WO 2005/062351 | 7/2005 |

OTHER PUBLICATIONS

Chinese Office Action dated Oct. 31, 2012 in corresponding Chinese Patent Application No. 200810003014.3.

U.S. Office Action mailed May 23, 2013 in corresponding U.S. Appl. No. 13/187,118.

U.S. Office Action mailed Jun. 12, 2013 in corresponding U.S. Appl. No. 13/186,211.

U.S. Office Action dated Sep. 20, 2013 in corresponding U.S. Appl. No. 13/187,118.

U.S. Re-issue U.S. Appl. No. 10/367,910, filed Feb. 19, 2003, entitled "Projection exposure apparatus and method with workpiece area detection," to Kyoichi Suwa.

U.S. Re-issue U.S. Appl. No. 11/122,215, filed May 5, 2005, entitled "Projection exposure apparatus and method with workpiece area detection," to Kyoichi Suwa.

"Depth-of-Focus Enhancement Using High Refractive Index Layer on the Imaging Layer", IBM Technical Disclosure Bulletin, vol. 27, No. 11, Apr. 1985, p. 6521.

H. Hata, "The Development of Immersion Exposure Tools", Litho Forum, International Sematech, Los Angeles, Jan. 27-29, 2004, Slide Nos. 1-22.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

H. Hogan, "New Semiconductor Lithography Makes a Splash", Photonics Spectra, Photonics TechnologyWorld, Oct. 2003 Edition, pp. 1-3.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

H. Kawata et al., "Optical Projection Lithography using Lenses with Numerical Apertures Greater than Unity", Microelectronic Engineering 9 (1989), pp. 31-36.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B. Lin, The $k_3$ coefficient in nonparaxial λ/NA scaling equations for resolution, depth of focus, and immersion lithography, *J. Microlith., Microfab., Microsyst.* 1(1):7-12 (2002).

B.J. Lin, "The Paths to Subhalf-Micrometer Optical Lithography", SPIE vol. 922, Optical/Laser Microlithography 256-269.

T. Matsuyama et al., "Nikon Projection Lens Update", SPIE Microlithography 2004, 5377-65, Mar. 2004.

S. Owa et al., "Advantage and Feasibility of Immersion Lithography", Proc. SPIE 5040 (2003).

S. Owa et al., "Immersion Lithography; its potential performance and issues", SPIE Microlithography 2003, 5040-186, Feb. 27, 2003.

S. Owa et al., "Update on 193nm immersion exposure tool", Litho Forum, International Sematech, Los Angeles, Jan. 27-29, 2004.

G. Owen et al., "1/8μm Optical Lithography", J. Vac. Sci. Technol. B., vol. 10, No. 6, Nov./Dec. 1992, pp. 3032-3036.

B.W. Smith et al., "Immersion Optical Lithography at 193nm", Future FAB International, vol. 15, Jul. 11, 2003.

G.W.W. Stevens, "Reduction of Waste Resulting from Mask Defects", Solid State Technology, Aug. 1978, vol. 21 008, pp. 68-72.

A. Suzuki, "Lithography Advances of Multiple Fronts", EEdesign, EE Times, Jan. 5, 2004.

M. Switkes et al., "Immersion Lithography at 157 nm", MIT Lincoln Lab, Orlando Jan. 2001, Dec. 17, 2001.

M. Switkes et al., "Immersion Lithography: Optics for the 50 nm Node", 157 Anvers-1, Sep. 4, 2002.

Search report from Singapore Patent Appl. No. SG 200403797-4, 4 pages, mailing date Feb. 25, 2005.

Korean Office Action for Korean Patent Application No. 10-2004-45198 with English translation of the Examiner's Grounds for Rejection mailed Jan. 23, 2006.

English language abstract for Japanese Patent Publication No. 10-303114, 1998.

Taiwan Search Report for corresponding Taiwan Patent Application No. 93117405 issued Mar. 19, 2007, 1 pg.

Examination for European Application No. 04 014 108.7-1226 mailed Apr. 29, 2008, 7 pgs.

European Search Report for Application No. 04014108.7-2222 mailed Apr. 27, 2006, 4 pages.

English Language Translation of Chinese Office Action for Application No. 200410059735.8 dated May 19, 2006, 8 pages.

Examination Report for European Patent. Appln. No. 04014108.7, dated Sep. 5, 2006, 6 pages.

English Translation of Second Office Action issued for Chinese Patent Appln. No. 200410059735.8, dated Dec. 29, 2006, 4 pages.

English Translation of Third Office Action issued for Chinese Patent Appln. No. 200410059735.8, dated May 25, 2007, 9 pages.

English Translation of Notice of Reasons for Refusal issued for Japanese Patent Appln. No. 2004-181684, dated Dec. 26, 2006, 4 pages.

English Translation of Decision of Rejection issued for Japanese Patent Appln. No. 2004-181684, dated Jul. 11, 2007, 2 pages.

Written Opinion issued for Singapore Patent Appln. No. 200403797-4, dated Oct. 13, 2005, 4 pages.

Examination Report issued for Singapore Patent Appln. No. 200403797-4, dated Jun. 2, 2006, 4 pages.

IMMERSION PHOTOLITHOGRAPHY SYSTEM AND METHOD USING MICROCHANNEL NOZZLES

This application is a continuation of co-pending U.S. patent application Ser. No. 13/187,118, filed on Jul. 20, 2011, which is a continuation of co-pending U.S. patent application Ser. No. 13/186,211, filed on Jul. 19, 2011, which is a continuation of co-pending U.S. patent application Ser. No. 12/060,514, filed on Apr. 1, 2008, now U.S. Pat. No. 8,004,649, which is a continuation of U.S. patent application Ser. No. 11/053,328, filed on Feb. 9, 2005, now U.S. Pat. No. 7,411,650, which is a continuation of U.S. patent application Ser. No. 10/464,542, filed on Jun. 19, 2003, now U.S. Pat. No. 6,867,844, each of the foregoing applications incorporated herein its entirety by reference.

FIELD

The present invention relates to liquid immersion photolithography, and more particularly, to a method and a system for controlling velocity profile of liquid flow in an immersion photolithographic system.

BACKGROUND

The practical limits of optical lithography assume that the medium through which imaging is occurring is air. This practical limit is defined by the effective wavelength equation $$\Lambda_{\mathit{eff}} = \frac{\lambda}{2 \cdot n \cdot NA},$$

where $\lambda$ is the wavelength of incident light, NA is the numerical aperture of the projection optical system, and n is the index of refraction of the medium. Now, by introducing a liquid (instead of the air) between a last lens element of the projection optical system and a wafer being imaged, the refractive index changes (increases), thereby enabling enhanced resolution by lowering the effective wavelength of the light source. Lowering a light source's wavelength automatically enables finer resolution of smaller details. In this way, immersion lithography becomes attractive by, for instance, effectively lowering a 157 nm light source to a 115 nm wavelength, thereby gaining resolution while enabling the printing of critical layers with the same photolithographic tools that the industry is accustomed to using today.

Similarly, immersion lithography can push 193 nm lithography down to 145 nm. In theory, older technology such as the 193 nm tools can now still be used. Also, in theory, many difficulties of 157 nm lithography—large amounts of $CaF_2$, hard pellicles, a nitrogen purge, etc.—can be avoided.

However, despite the promise of immersion photolithography, a number of problems remain, which have so far precluded commercialization of immersion photolithographic systems. These problems include optical distortions. For example, during immersion lithography scanning, sufficient g-loads are created that can interfere with system performance. These accelerative loads can cause a vibrational, fluidic shearing interaction with the lens resulting in optical degradation. The up and down scanning motions within the lens-fluid environment of Immersion Lithography can generate varying fluidic shear forces on the optics. This can cause lens vibrational instability, which may lead to optical "fading". Other velocity profile non-uniformities can also cause optical distortions.

SUMMARY

The present invention is directed to an immersion photolithography system with a near-uniform velocity profile of the liquid in the exposure area that substantially obviates one or more of the problems and disadvantages of the related art.

There is provided a liquid immersion photolithography system including an exposure system that exposes a substrate with electromagnetic radiation, and includes a projection optical system that focuses the electromagnetic radiation on the substrate. A liquid supply system provides liquid flow between the projection optical system and the substrate. A plurality of micronozzles are optionally arranged around the periphery of one side of the projection optical system so as to provide a substantially uniform velocity distribution of the liquid flow in an area where the substrate is being exposed.

In another aspect there is provided a liquid immersion photolithography system including an exposure system that exposes an exposure area on a substrate with electromagnetic radiation and includes a projection optical system. A liquid flow is generated between the projection optical system and the exposure area. A microshower is at one side of the projection optical system, and provides the liquid flow in the exposure area having a desired velocity profile.

Additional features and advantages of the invention will be set forth in the description that follows. Yet further features and advantages will be apparent to a person skilled in the art based on the description set forth herein or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS/FIGS.

The accompanying drawings, which are included to provide a further understanding of the exemplary embodiments of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the embodiments of the present invention, examples of which are illustrated in the accompanying drawings.

One major problem in immersion photolithography is the non-uniformity of the liquid flow, particularly its gradient in the vertical direction. The non-uniformity is due primarily to the fact that near a moving surface, the liquid is in contact with that surface (e.g., a surface of a wafer). For example, during scanning, the wafer moves relative to the exposure system, creating a "dragging effect" near its surface. Thus, the laws of fluid dynamics dictate that the fluid velocity relative to the wafer surface is zero in those areas (or at least close to zero), while fluid velocity is maximum further away from the wafer surface. Similarly, the fluid velocity relative to the bottom surface of the lens is zero. These fluid velocity variations are known as "boundary layer" velocity profiles. The combination of these effects produces a shearing force in the liquid that creates a twofold optical distortion problem: 1) the generation of inertial vibrational forces upon the aperture hardware (resulting in optical distortion), and 2) the formation of velocity striations within the fluid, which cause additional optical distortions.

Additionally, injection of liquid into the exposure area also provides a liquid flow with potential additional non-uniformities in the velocity distribution. For example, a number of striations can exist within the fluid, further degrading exposure quality. Similarly, air bubbles, opto-fluidic vibrations, or turbulence in the liquid flow also can degrade the overall performance of the photolithographic system because of the introduction of optical distortions into the exposure process. Thus, dealing with velocity profile non-uniformities is important from the perspective of the quality of imaging in a photolithographic system. In the ideal case, the velocity profile of the liquid is substantially uniform everywhere.

Figure 1:
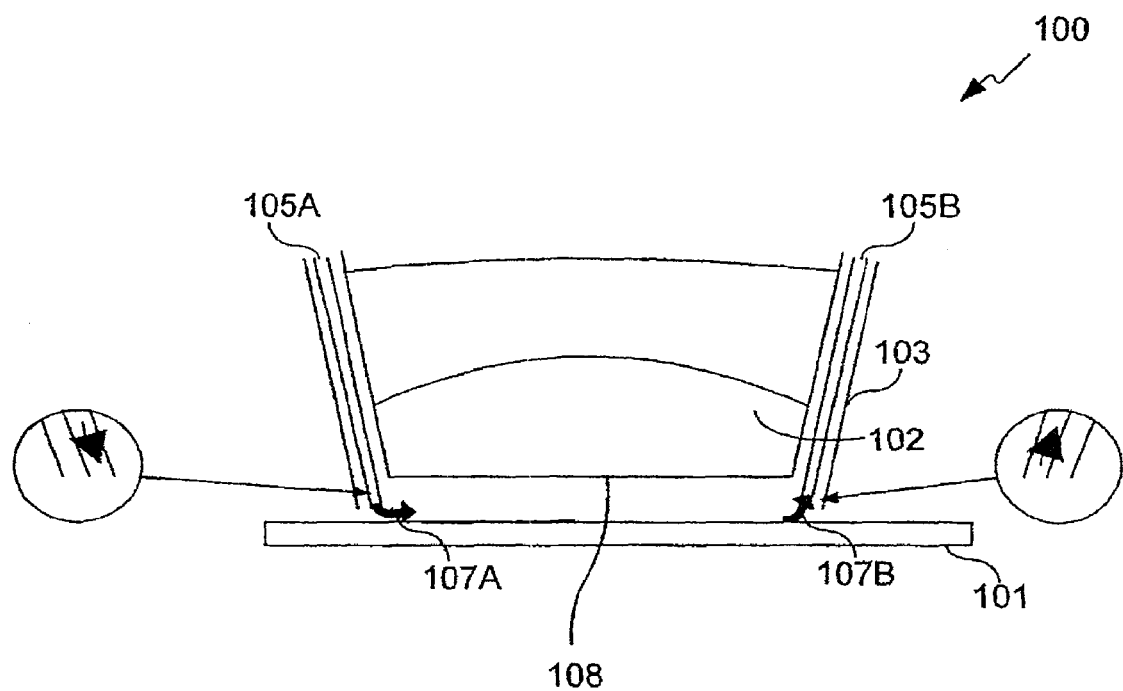
FIG. 1 shows a side view of a basic liquid immersion photolithography setup.

FIG. 1 illustrates a liquid immersion photolithographic system of the present invention in a block diagram form. As shown in FIG. 1, a projection optical system 100 of a photolithographic tool includes a lens 102 (which is typically comprised of multiple lens elements). In this figure, the lens 102 has a flat bottom surface 108, although that need not be the case. Lens height 409 (see FIG. 4) may be adjustable to maintain a specific distance to the wafer 101.

The projection optical system 100 also includes a housing 103 (only the lower portion is shown). The housing 103 includes an annular liquid channel 105A, and optionally a plurality of other such channels 105B, etc. Liquid flows through the channels 105 (flowing in through the channel 105A in this figure, and flowing out through the channel 105B). The arrows 107A, 107B designate the direction of liquid flow over a wafer 101, as the wafer 101 is being scanned across a field of view of the projection optical system 100.

Figure 2:
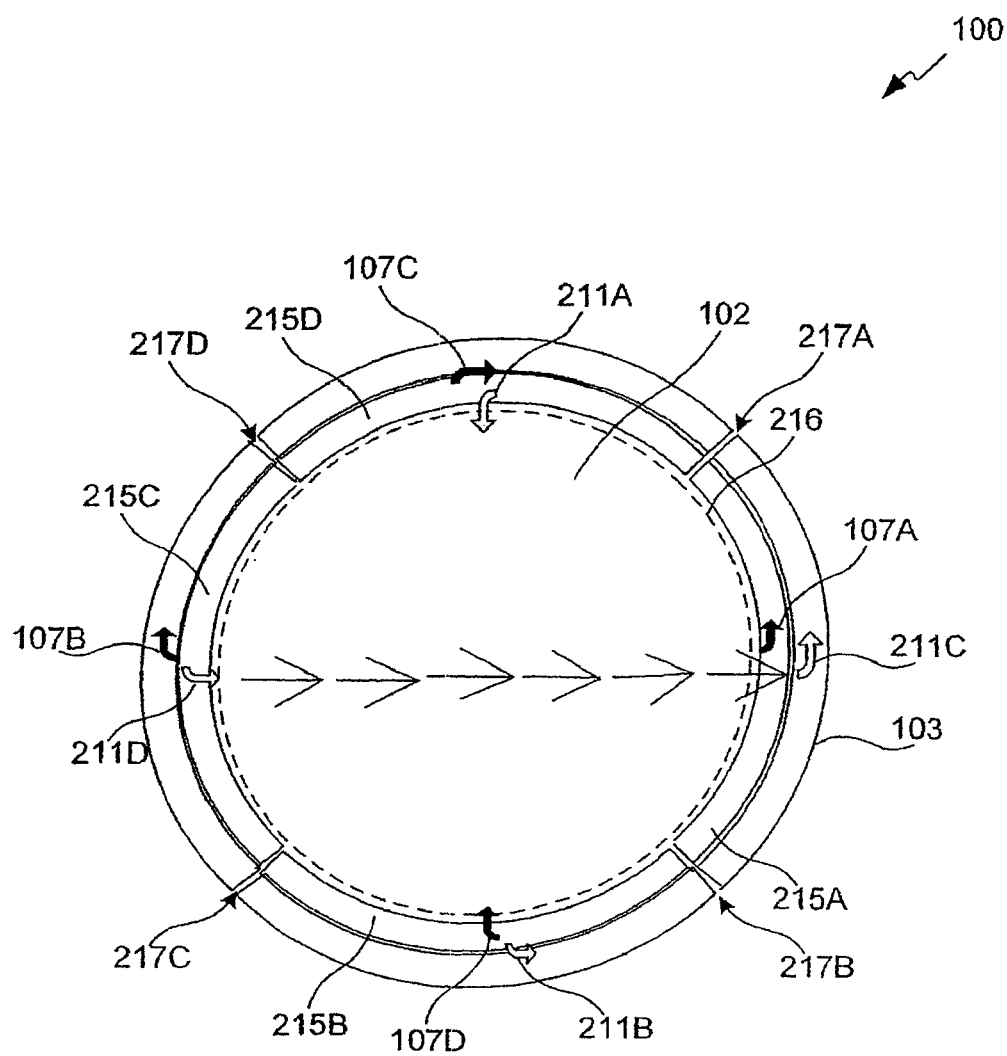
FIG. 2 shows a plan view of the setup of FIG. 1.

FIG. 2 illustrates a bottom-up view of the structure shown in FIG. 1. As shown in FIG. 2, a clear aperture area 216 defines an exposure area of the projection optical system 100 and the lens 102. The various arrows 107A-107D, 211A-211D illustrate possible liquid flow directions at any given time. As may be further seen in FIG. 2, the housing 103 also includes a number of pressurized chambers 215A-215D. Each pressurized chamber 215 may also be referred to as a "plenum." The plenum 215 therefore acts as a pressure source, as discussed below. It will also be appreciated that the liquid flow can be turned off completely when no exposure is taking place, or when the wafer 101 is being swapped.

Further, as shown in FIG. 2, the lower portion of the housing 103 may be divided into a number of sections. In this figure, there are four such sections (quadrants), separated by gaps 217A-217D. It will be appreciated that the number of such sections may be more or fewer than four, although, in most applications, it is expected that four quadrants is an optimal number. For example, for motion only along one axis, dividing the housing 103 into two sections may be sufficient. For X-Y motion, four sections (quadrants) are preferred. For even greater control, eight sections may be needed. This sectioning permits control over liquid flow direction, as also discussed further below. Controlling the direction of liquid flow makes it possible to counteract mechanical strains on the lens 102, therefore the flow profile in the X direction (especially during a step) may be different from the flow profile in the Y direction (especially during a scan).

Figure 3:
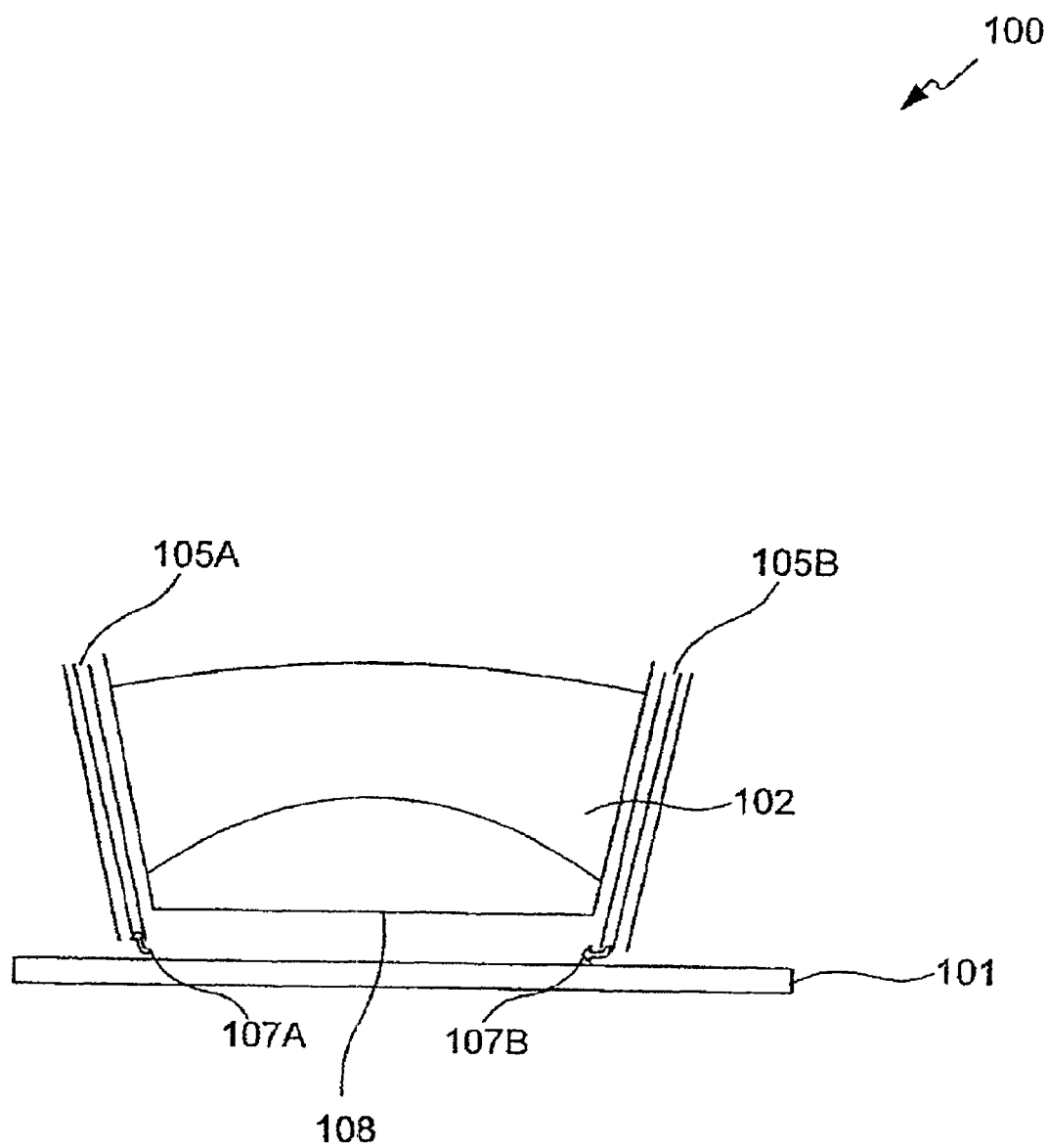
FIG. 3 shows the basic liquid immersion photolithography setup with liquid flow direction reversed, compared to FIG. 1.

FIG. 3 illustrates the same structure as in FIG. 1, except that the direction of the liquid flow is reversed. As will be appreciated by one of ordinary skill in the art, the ability to reverse the direction of liquid flow is important in a practical photolithographic system, since the direction of wafer motion is normally not limited to just one direction. Similarly, it will be appreciated by one of ordinary skill in the art that, as in FIG. 2, the wafer 101 can move both in the X direction and the Y direction. Thus, dividing the housing 103 into quadrants permits the direction of liquid flow to be adjusted for any direction of wafer movement.

Figure 4:
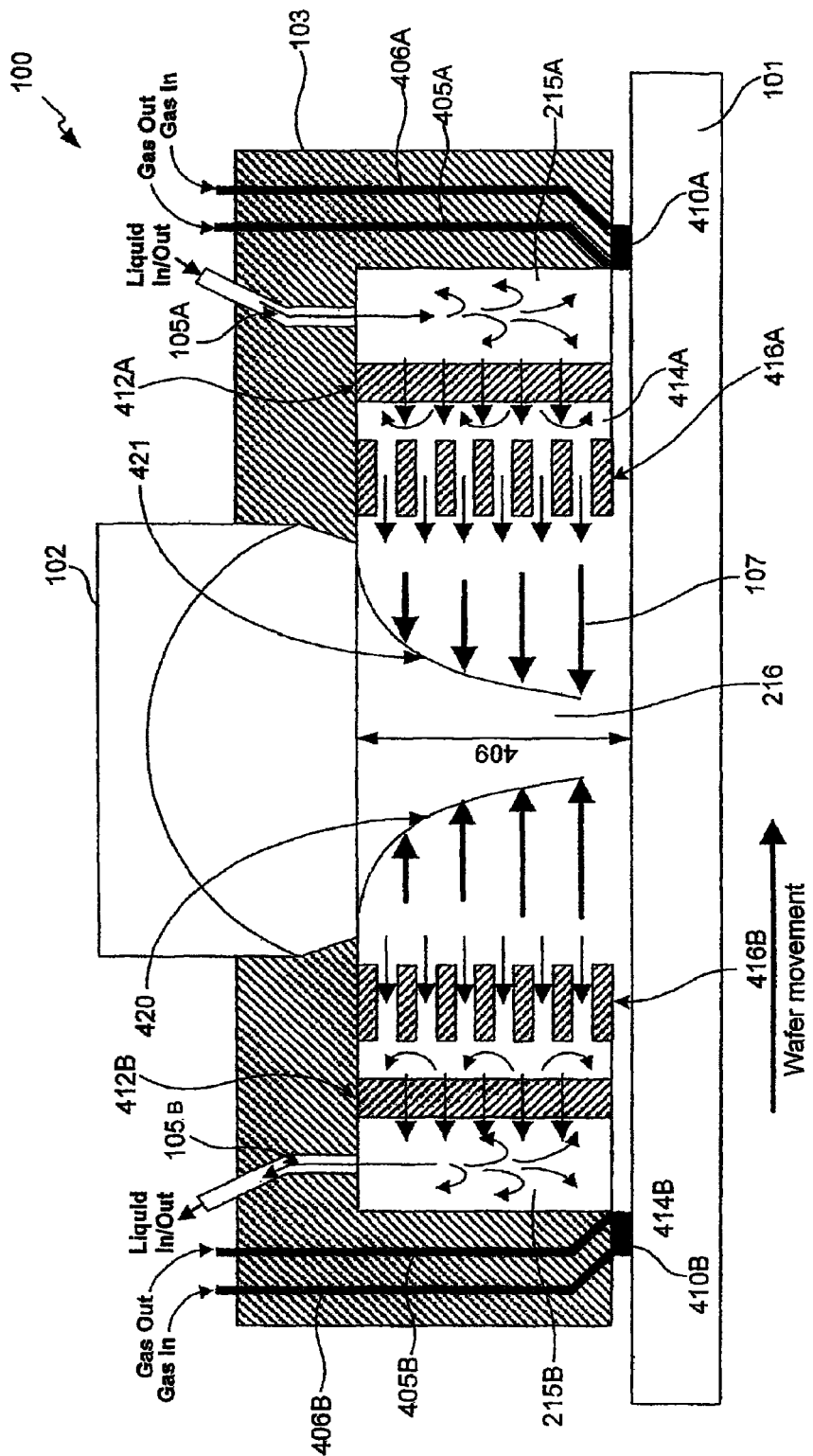
FIG. 4 shows additional detail of the liquid immersion photolithography system.

FIG. 4 illustrates an embodiment of the present invention in additional detail. As shown in FIG. 4, the lens 102 is mounted in the housing 103. The housing 103 has the annular channels 105A, 105B, through which liquid flows in and out from a liquid supply system (not shown in these figures). From the channel 105A, the liquid then enters a first large plenum 215A. It then flows through a diffuser screen 412A, into a first small plenum 414A (which is typically smaller than the first plenum 215A). The diffuser screen 412A helps remove the turbulence and air bubbles that may be present in the first large plenum 215A. The diffuser screen 412 also acts as a pressure drop screen.

The first small plenum 414A also acts as a pressure chamber. From the first small plenum 414A, the liquid then flows through a plurality of microchannel nozzles (micronozzles) 416A, arranged in a form of a microshower. Thus, by the time the liquid reaches the micronozzles 416, the pressure at the entry to all the micronozzles 416 is uniform, and turbulence and gas bubbles have been substantially removed from the liquid. After the micronozzles 416, the liquid flows into the clear aperture area 216 under the lens 102, such that the space between the lens 102 and the wafer 101 is filled with the liquid.

In the clear aperture area 216, the liquid flow is uniform with height, and free of turbulence, bubbles, striations and other imperfections that affect optical image quality.

On the other side of the clear aperture area 216, the liquid once again flows through a set of microchannel nozzles 416B, into a second small plenum 414B, through a diffuser screen 412B, into a second large plenum 215B and out through the channel 105B.

Thus, with the relative motion of the wafer 101 from left to right in FIG. 4, the wafer 101 creates a "dragging effect" on the liquid. The direction of the liquid flow therefore needs to be from right to left, to counteract the "dragging effect," and result in substantially uniform velocity profile.

In FIG. 4, 420 designates effective fluid velocity profile within the clear aperture area 216 as induced by wafer 101 motion. 421 designates counter-injected fluid velocity profile from the microchannel nozzles 416, yielding near net-zero resultant fluid velocity at the interface between the lens 102 and the liquid in clear aperture area 216.

The microchannel nozzles 416 also refresh (i.e., replace) the working liquid from time to time (which may be necessary to prevent its disassociation over time, since exposure to intense electromagnetic radiation may break down the molecules of the liquid), so as to preclude thermal gradients from causing refractive distortions and image quality degradation. Avoiding dissociation of liquid (for example water) due to constant flow is another advantage. At the short exposure wavelength, water can dissociate at approximately 2.86 J/cm$^2$ RT and normal P turns to $4.75*10^{-19}$ J per molecule. At 193 nm with one photon carries $1.03*10^{-18}$ J. Additionally, keeping the liquid refreshed allows to maintain a constant temperature of the liquid. The liquid may be refreshed during exposure, or between exposures.

The micronozzles 416 also act as a buffer against inertial shearing forces between the optics and the liquid. Note that the shearing force is dv defined by the equation $$F = A \cdot \mu \cdot \frac{dv}{dx},$$

where A is the area, $\mu$ is a viscosity parameter, x is a distance variable, and v is the velocity. The shearing force is approximately 1 Newton in the case of a typical 100 micron gap between the wafer 101 and the lens 102. Neutralizing these shearing forces is accomplished by inertially dampening the relative accelerative motion between the lens 102 and fluid. This is accomplished by simply creating fluidic motion in a direction opposite to scanning. The microchannel nozzles 416 also act as a buffer against inertial shearing forces between the optics and fluid.

Additionally, the housing 103 includes a system for supplying gas to remove any excess liquid from the wafer 101. The housing 103 includes a supply side annulus 406A for gas inflow from a gas supply system (not shown in FIG. 4), a gas seal 410A, which bridges the distance to the wafer 101 and makes a "squeegee" so as to contain and remove any excess liquid, and a return side gas outflow annulus 405A (through which excess liquid is removed). The excess liquid may be removed through the return side gas outflow annulus 405A, together with the exhausted gas. A similar structure may be found in an opposite quadrant of the housing 103, as shown on the left side of FIG. 4. The gas supply system works in conjunction with the liquid supply system, whenever there is liquid flow present, and, consequently, need only be turned on when there is liquid flow in the clear aperture area 216.

As noted above, in FIG. 4, with the wafer movement from left to right, the liquid flow is "in" at channel 105A, and "out" at channel 105B. When the scan direction is reversed, the liquid flow reverses as well.

Figure 5:
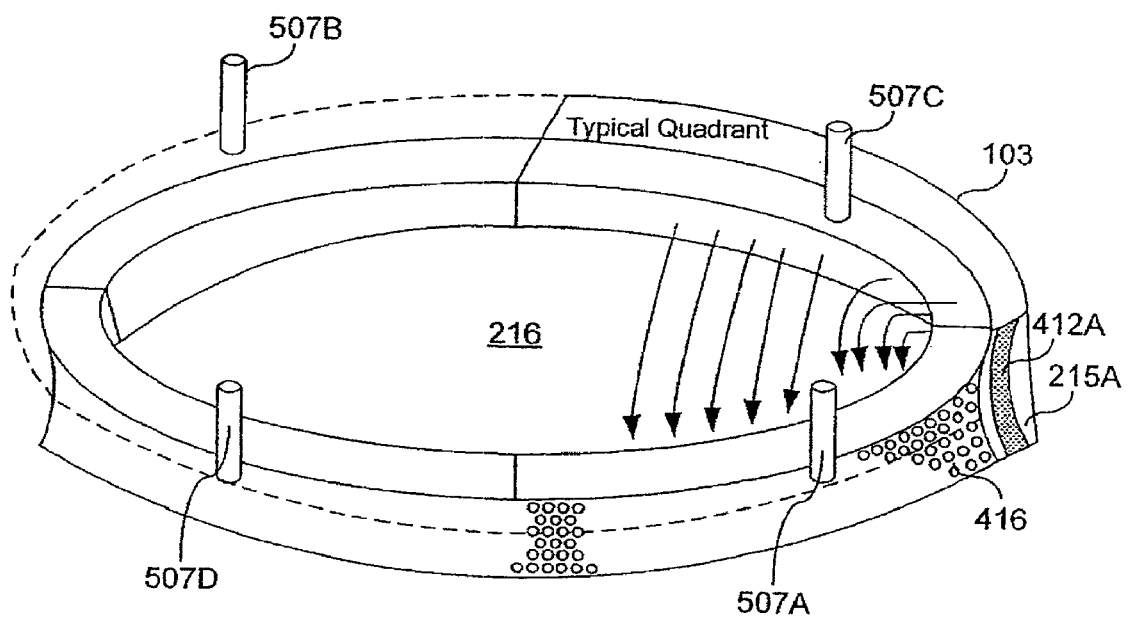
FIG. 5 shows a partial isometric view of the structure of FIG. 4.

FIG. 5 shows a partial isometric view of the micronozzle structure area of FIG. 4. The channels 105A-105D (not shown in FIG. 5) are connected to outer tubes 507A-507D, through which liquid is supplied. Similarly, though not shown in this figure, the annuli 405, 406 may be connected to tubular gas couplings.

Figure 6:
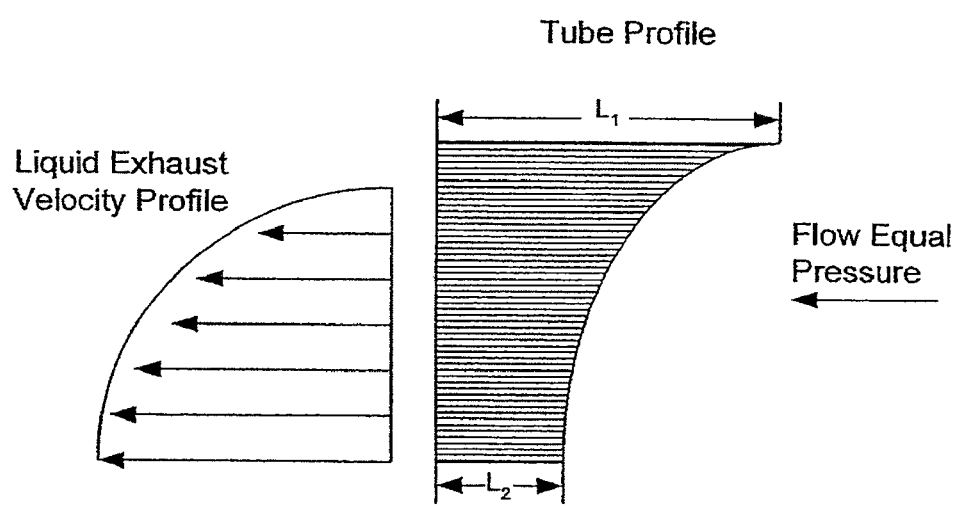
FIG. 6 shows an exemplary liquid velocity profile.

FIG. 6 illustrates an example of a liquid exhaust velocity profile that may be used in the present invention. As will be appreciated by one of ordinary skill in the art, a "natural" velocity profile is not uniform with height in FIG. 4, but rather may have a vertical gradient, which can cause optical distortion. To compensate for this natural gradient, different lengths of tubes (micronozzles 416) may be used, as shown in FIG. 6. In FIG. 6, the micronozzle length ranges from a maximum of $L_1$ to a minimum of $L_2$, resulting in approximately the velocity profile at the exit of the micronozzles 416 shown on the left of FIG. 6. The longer the micronozzle 416, the lower the output velocity of the liquid from that particular micronozzle. Furthermore, the micronozzles 416 themselves may have different diameters, if needed to further control the velocity profile. Note further that the tubes of the micronozzles 416 need not necessarily be parallel to the wafer 101, to further control the velocity profile.

The height of the liquid above the wafer 101, in a typical system, is approximately 100 microns. Greater height generally results in a need for more micronozzles in 416A due to a larger volume in which velocity profile needs to be controlled.

Thus, with careful selection of the lengths, diameters and orientations of the micronozzles 416, the velocity profile in the clear aperture area 216 of the wafer 101 may be controlled, resulting in a substantially uniform velocity profile throughout the clear aperture area 216, thereby improving exposure quality. In essence, the velocity profile generated by a structure such as shown in FIG. 6 may be "opposite" of the "natural" profile that would exist otherwise. Thus, the characteristics of the micronozzles 416 are tailored to result in a substantially uniform velocity profile.

During scanning, the wafer 101 moves in one direction, while the liquid is recirculated and injected in the opposite direction. The effect of the present invention is therefore to neutralize the liquid velocity profile induced by the scanning motion, causing inertial dampening between the lens 102 and the liquid. In other words, the net effect is a "zero" net inertia and velocity profile steering away from motion. Depending on the direction of the liquid flow, either a reduction or elimination of shear forces, or a reduction in optical distortions may result. Thus, the immersion lithographic process is capable of performing at peak levels due to constant fluid refresh, avoidance of gas bubbles, and the buffering of optofluidic vibrations.

Note further that while the liquid in the plenum 215 may have turbulence and gas bubbles, by the time it travels through the diffuser screen 412, the flow is uniform. Therefore, after passing through the diffuser screen 412, the plenum 414, and exiting from the micronozzles 416, the liquid flow has a desired velocity profile, substantially without imperfections caused by striations, opto-fluidic vibrations, turbulence, gas bubbles, and other non-uniformities, resulting in improved image quality.

As noted above, the bottom surface 108 of the lens 102 need not be flat. It is possible to use a lens 102 with a curved bottom surface 108, and compensate for any induced velocity profile non-uniformities with an appropriate arrangement of micronozzle lengths, diameters, and orientations, to result in a near-uniform velocity profile.

The micronozzles 416 may be constructed using conventional lithographic techniques on silicon material. On a microscopic scale, the micronozzles 416 resemble a honeycomb material composed of tubes that are stacked in a staggered formation that exhibits key characteristic dimensions of hydraulic diameter and length. The micronozzles 416 may be flared out into the clear aperture area 216.

Typical tubular diameters of the micronozzles 416 may vary, for example, from a few microns to tens of microns (e.g., 5-50 microns), and in some cases, up to 5 mm in diameter, and lengths of between about 10 to 100 diameters. Other lengths and/or diameters may be used. Slits, rather than round nozzles, may also be used. The number of micronozzles per unit area may also be varied.

For 193 nanometer imaging, the liquid is preferably water (e.g., deionized water), although other liquids, for example, cycle-octane, Krypton® (Fomblin oil) and perfluoropolyether oil, may be used.

The present invention results in a number of benefits to a liquid immersion photolithographic system. For example, in a step and scan system, transmission is improved, and there is less distortion. Dust particles in the air cannot enter the clear aperture area 216 between the lens 102 and the wafer 101, since the liquid itself does not contain any dust, and the presence of the liquid acts as a barrier to the dust being present in the clear aperture area 216 during exposure. Preferably, the liquid is brought in after the wafer 101 has been loaded onto a wafer stage, and removed before the wafer 101 is unloaded. This minimizes dust and particulate contamination. Additionally, other ways of keeping the liquid from spilling during wafer exchange are possible as well, and the present invention is not limited to just the approach described above.

The fluid velocity profile induced by the scanning motion is neutralized, causing inertial dampening between lens 102 and the shearing fluid. Aside from acting as inertial dampers, the micronozzles 416 serve to refresh the working fluid volume, thereby eliminating refractive distortions due to thermal gradients created by the light source. A side benefit of the micronozzles 416 is their ability to discourage the formation of gas-bubbles during volume refresh. Also, the size of these micronozzles 416 prevents the formation of gas-bubbles that plague more conventional refresh techniques. All of these benefits allow the use of generally existing photolithographic tools and wavelengths to define much smaller features on a semiconductor surface.

In an embodiment, there is provided a liquid immersion photolithography system comprising: an exposure system that exposes a substrate with electromagnetic radiation and includes a projection optical system that focuses the electromagnetic radiation on the substrate; a liquid supply system that provides liquid flow between the projection optical system and the substrate; and a plurality of micronozzles arranged around a periphery of the projection optical system so as to provide a substantially uniform velocity distribution of the liquid flow between the substrate and the projection optical system.

In an embodiment, the plurality of micronozzles include a plurality of tubes of varying lengths. In an embodiment, the varying lengths of the tubes provide a velocity profile that compensates for non-uniformities. In an embodiment, the liquid supply system includes: an input channel for delivering the liquid into a first plenum; a first diffuser screen through which the liquid can flow into a second plenum, wherein the liquid can then flow into the micronozzles. In an embodiment, the liquid supply system further comprises: a second plurality of micronozzles removing the liquid from the exposure area into a third plenum; a second diffuser screen through which the liquid flows into a fourth plenum; and an output channel through which the liquid is circulated. In an embodiment, the projection optical system includes a housing with a gas seal between the housing and the substrate. In an embodiment, the housing includes a plurality of annular channels connected to the gas seal through which negative pressure is maintained around the exposure area so as to remove stray liquid. In an embodiment, the micronozzles are between 5 microns and 5 millimeters in diameter. In an embodiment, the micronozzles are slit-shaped. In an embodiment, at least some of the micronozzles include a portion that flares out into an area between the substrate and the projection optical system. In an embodiment, a direction of the liquid flow is reversible. In an embodiment, the liquid supply system includes at least three channels through which liquid can flow. In an embodiment, the liquid supply system compensates for non-uniformities in a velocity profile.

In an embodiment, there is provided a liquid immersion photolithography system comprising: an exposure system that exposes an exposure area on a substrate with electromagnetic radiation and includes a projection optical system; means for providing a liquid flow between the projection optical system and the exposure area; and a first microshower at one side of the projection optical system that provides the liquid flow having a desired velocity profile when the liquid flow is present in the exposure area.

In an embodiment, the microshower includes a plurality of tubes of varying lengths. In an embodiment, the varying lengths of the tubes provide a velocity profile that compensates for non-uniformities. In an embodiment, the system further comprises a liquid supply system that includes: an input channel for delivering the liquid into a first plenum; a first diffuser screen through which the liquid can flow into a second plenum, wherein the liquid flows into the exposure area through the microshower. In an embodiment, the liquid supply system further comprises: a second microshower for removing the liquid from the exposure area into a third plenum; a second diffuser screen through which the liquid can flow into a fourth plenum; and an output channel through which the liquid can circulate out of the exposure area. In an embodiment, the projection optical system includes a housing with a gas seal between the housing and the substrate. In an embodiment, the housing includes a plurality of channels through which negative pressure is maintained around the exposure area so as to remove stray liquid. In an embodiment, the microshower has micronozzles that are between 5 microns and 5 millimeters in diameter. In an embodiment, at least some of the micronozzles include a portion that flares out into the exposure area. In an embodiment, the micronozzles are slit-shaped. In an embodiment, a direction of the liquid flow is reversible. In an embodiment, the liquid supply system includes at least three channels through which liquid can flow. In an embodiment, the microshower compensates for non-uniformities in the velocity profile due to scanning.

In an embodiment, there is provided a liquid immersion photolithography system comprising: an exposure system that exposes an exposure area on a substrate with electromagnetic radiation and includes a projection optical system; and a liquid flow between the projection optical system and the exposure area having a velocity profile that compensates for relative motion of the exposure system and the substrate.

In an embodiment, there is provided a liquid immersion photolithography system comprising: an exposure system that exposes an exposure area on a substrate with electromagnetic radiation and includes a projection optical system; and a plurality of micronozzles around a periphery of a lens of the projection optical system that provide a liquid flow in the exposure area.

In an embodiment, there is provided a liquid immersion photolithography system comprising: an exposure system that exposes a substrate with electromagnetic radiation and includes a projection optical system that focuses the electromagnetic radiation on the substrate; and a liquid supply system that provides liquid flow between the projection optical system and the substrate, wherein a direction of the liquid flow may be changed so as to compensate for direction of movement of the substrate.

In an embodiment, the system further includes a plurality of micronozzles arranged around a periphery of the projection optical system so as to provide a substantially uniform velocity distribution of the liquid flow between the substrate and the projection optical system. In an embodiment, the plurality of micronozzles include a plurality of tubes of varying lengths. In an embodiment, the varying lengths of the tubes provide a velocity profile that compensates for non-uniformities. In an embodiment, the liquid supply system includes: an input channel for delivering the liquid into a first plenum; a first diffuser screen through which the liquid can flow into a second plenum, wherein the liquid can then flow into the micronozzles. In an embodiment, the liquid supply system further comprises: a second plurality of micronozzles removing the liquid from the exposure area into a third plenum; a second diffuser screen through which the liquid flows into a fourth plenum; and an output channel through which the liquid is circulated. In an embodiment, the liquid supply system compensates for non-uniformities in a velocity profile.

In an embodiment, there is provided a method of exposing a substrate comprising: projecting electromagnetic radiation onto the substrate using a projection optical system; delivering a liquid flow between the projection optical system and the substrate; and controlling a velocity profile of the liquid flow to as to provide a substantially uniform velocity profile.

In an embodiment, the method further comprises removing excess liquid from the substrate using a gas supply system. In an embodiment, the method further comprises reversing direction of the liquid flow.

In an embodiment, there is provided a method of exposing a substrate comprising: projecting electromagnetic radiation onto the substrate using a projection optical system; delivering a liquid flow between the projection optical system and the substrate; and changing a direction of the liquid flow so as to compensate for a change in a direction of movement of the substrate.

In an embodiment, the method further comprises removing excess liquid from the substrate using a gas supply system.

CONCLUSION

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of functional building blocks and method steps illustrating the performance of specified functions and relationships thereof. The boundaries of these functional building blocks and method steps have been arbitrarily defined herein for the convenience of the description. Alternate boundaries can be defined so long as the specified functions and relationships thereof are appropriately performed. Also, the order of method steps may be rearranged. Any such alternate boundaries are thus within the scope and spirit of the claimed invention. One skilled in the art will recognize that these functional building blocks can be implemented by discrete components, application specific integrated circuits, processors executing appropriate software and the like or any combination thereof. Thus, the breadth and scope of the present invention should not be limited by any of the above-described exemplary embodiments, but should be defined only in accordance with the following claims and their equivalents.

What is claimed is:

1. A device manufacturing method, comprising:
   projecting a patterned radiation beam through a liquid onto a target portion of a radiation-sensitive substrate; and
   extracting the liquid using a two dimensional array of extraction openings in a common surface.

2. The method of claim 1, comprising substantially confining the liquid to a space between the substrate and a projection system used to project the patterned beam, wherein the array extends at least partly around an outer periphery of the space, the outer periphery of the space being smaller in plan than the substrate.

3. The method of claim 1, comprising substantially confining the liquid to a space between the substrate and a projection system used to project the patterned beam using a barrier member, the barrier member providing a surface surrounding an outer periphery of the space, wherein the array is formed in the surface to surround the outer periphery of the space and the outer periphery of the space is smaller in plan than the substrate.

4. The method of claim 1, wherein at least part of the array extends at an angle from horizontal.

5. The method of claim 1, comprising substantially confining the liquid to a space between the substrate and a projection system used to project the patterned beam, wherein at least part of the array is located above the substrate and lower than a surface of the projection system in contact with the liquid.

6. The method of claim 5, further comprising supplying the liquid to the substrate using an inlet, the inlet located above the at least part of the array.

7. The method of claim 5, further comprising supplying the liquid to the substrate using an inlet, the inlet located below the surface of the projection system in contact with the liquid.

8. The method of claim 7, wherein the inlet opens in a direction substantially parallel to a surface of the substrate onto which the patterned radiation beam is projected.

9. A device manufacturing method, comprising:
   projecting a patterned radiation beam through a liquid onto a target portion of a radiation-sensitive substrate; and
   extracting the liquid through a screen.

10. The method of claim 9, comprising substantially confining the liquid to a space between the substrate and a projection system used to project the patterned beam, wherein the screen extends at least partly around an outer periphery of the space.

11. The method of claim 10, comprising substantially confining the liquid to a space between the substrate and a projection system used to project the patterned beam using a barrier member providing a surface surrounding the space, the screen being formed in the surface and surrounding the outer periphery of the space.

12. The method of claim 9, wherein the screen comprises a diffuser screen.

13. The method of claim 9, wherein at least part of the screen is located above the substrate and lower than a surface of the projection system used to project the patterned beam, the surface of the projection system being in contact with the liquid.

14. The method of claim 13, further comprising supplying the liquid to the space using an inlet, the inlet located above the at least part of the screen.

15. The method of claim 13, further comprising supplying the liquid to the space using an inlet, the inlet located below the surface of the projection system.

16. The method of claim 15, wherein the inlet opens in a substantially horizontal direction.

17. The method of claim 16, wherein the inlet comprises a plurality of openings.

18. The method of claim 9, wherein at least part of the screen extends at an angle from horizontal.

19. A device manufacturing method, comprising:
    projecting a patterned radiation beam through a liquid onto a target portion of a radiation-sensitive substrate; and
    extracting the liquid using a plurality of extraction openings in a two-dimensional staggered formation.

20. The method of claim 19, wherein the staggered formation comprises a honeycomb arrangement.

* * * * *